(12) United States Patent
Komatsu

(10) Patent No.: US 8,680,764 B2
(45) Date of Patent: Mar. 25, 2014

(54) METHOD OF MANUFACTURING ORGANIC EL DEVICE AND ORGANIC EL DEVICE

(75) Inventor: Shinsuke Komatsu, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/453,305

(22) Filed: Apr. 23, 2012

(65) Prior Publication Data
US 2012/0274202 A1 Nov. 1, 2012

(30) Foreign Application Priority Data

Apr. 27, 2011 (JP) ................. 2011-098976
Feb. 9, 2012 (JP) ................. 2012-026721

(51) Int. Cl.
*H01J 1/62* (2006.01)
*H01J 63/04* (2006.01)

(52) U.S. Cl.
USPC ........... 313/506; 313/483; 313/498; 313/500; 313/501; 313/502; 313/503; 313/504; 313/505

(58) Field of Classification Search
None
See application file for complete search history.

(56) References Cited

U.S. PATENT DOCUMENTS

| | | | |
|---|---|---|---|
| 7,234,984 B2 * | 6/2007 | Nishikawa et al. | ............... 445/2 |
| 8,193,698 B2 * | 6/2012 | Klein et al. | ................... 313/504 |
| 2003/0222861 A1 | 12/2003 | Nishikawa et al. | |
| 2008/0100211 A1 | 5/2008 | Klein et al. | |

FOREIGN PATENT DOCUMENTS

| | | |
|---|---|---|
| JP | 2001-117534 | 4/2001 |
| JP | 2001-176661 | 6/2001 |
| JP | 2003-272844 | 9/2003 |
| JP | 2007-042498 | 2/2007 |
| JP | 2008-108731 | 5/2008 |

OTHER PUBLICATIONS

English machine translation of JP 2001-117534 (Ishizuka et al).*

* cited by examiner

*Primary Examiner* — Natalie Walford
(74) *Attorney, Agent, or Firm* — Panasonic Patent Center

(57) ABSTRACT

Provided is a method of manufacturing an organic EL device, wherein a device which has a cathode, an anode facing the cathode, and an organic layer is disposed between the cathode and the anode is provided, a pulsed laser is transmitted through the cathode and is irradiated to the organic layer, and a conductive part having an electrical resistance value lower than that of the organic layer is formed in the organic layer.

5 Claims, 12 Drawing Sheets

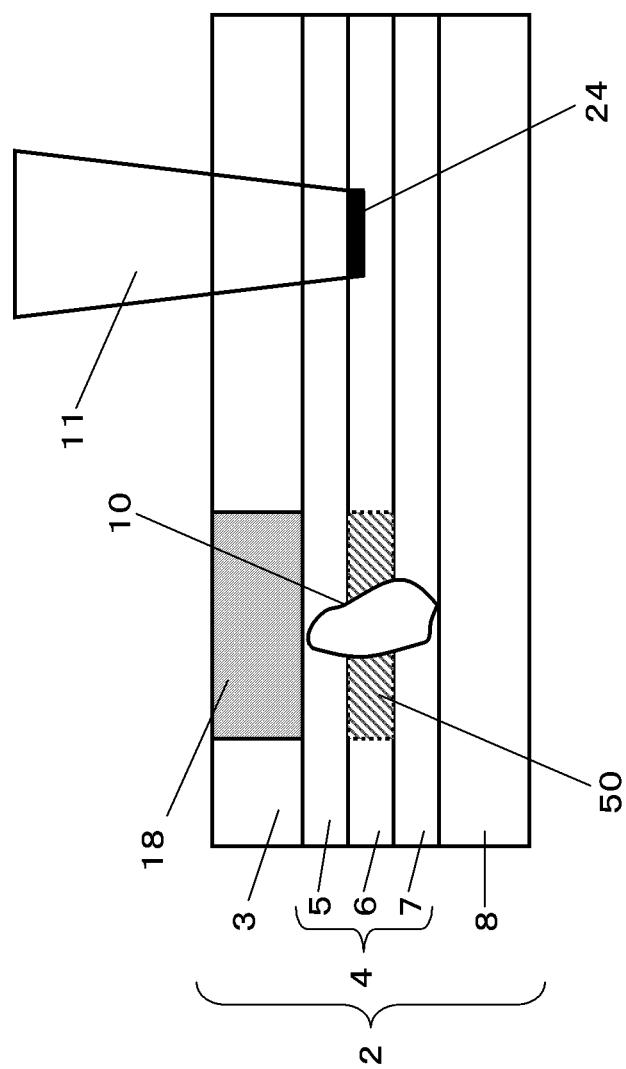

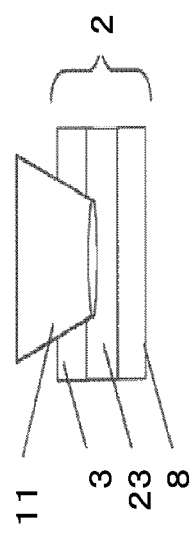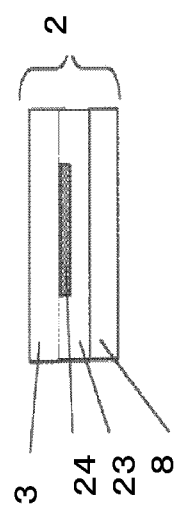
Fig.2A
Fig.2B

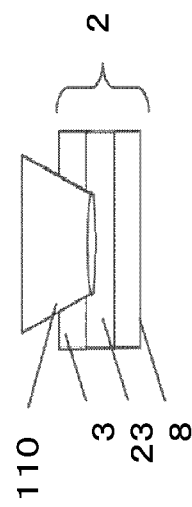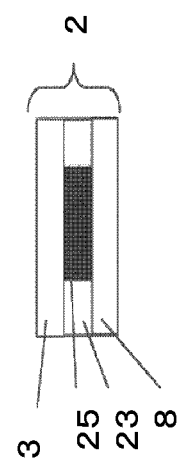
Fig.3A
Fig.3B

| | BRIGHTNESS IMPROVEMENT | REPAIR |
|---|---|---|
| ENERGY | 30nJ~60nJ | 2.8nJ~4.8nJ |
| PULSE WIDTH | 1000 psec or LESS | 600 fsec~50 nsec |
| PROCESSING MODE | ABLATION PROCESSING | THERMAL PROCESSING |
| WAVELENGTH | 900 nm or MORE | 900 nm or MORE |

Fig.5

METHOD OF MANUFACTURING ORGANIC EL DEVICE AND ORGANIC EL DEVICE

CROSS REFERENCE TO RELATED APPLICATIONS

This application is entitled and claims the benefit of Japanese Patent Application No. 2011-098976, filed on Apr. 27, 2011 and Japanese Patent Application No. 2012-026721, filed on Feb. 9, 2012, the disclosure of which including the specification, drawings and abstract is incorporated herein by reference in its entirety.

BACKGROUND

1. Technical Field

The present technical field relates to a method of manufacturing an organic EL device and an organic EL device.

2. Background Art

Recently, organic EL (Electro luminescence) display apparatuses have received attention. Each of the organic EL display apparatus includes a pluralities of pixels, and each of the pixels includes organic EL device (Organic light-emitting diode).

As shown in FIG. 12, an organic EL device 100 of the related art has cathode 3, organic material layer 4, and anode 8. Organic material layer 4 is disposed between cathode 3 and anode 8. Organic material layer 4 includes electron transporting layer 5 having electron conductivity, light emitting layer 6, and hole (positive hole) transporting layer 7 having Hall conductivity. In addition, light emitting layer 6 is interposed by electron transporting layer 5 and hole transporting layer 7. When applying the voltage between anode 8 and cathode 3, electrons are injected from cathode 3 into light emitting layer 6 via electron transporting layer 5, and holes are injected from anode 8 into light emitting layer 6 via hole transporting layer 7. When the injected electron and hole are recombined in light emitting layer 6, light emitting layer 6 emits light 1.

Thickness 9 (hereinafter, referred to as "organic material layer thickness 9") of organic material layer 4 is very thin, equal to or less than several hundred nm. When forming such organic material layer 4, in some cases, foreign matter composed of a conductor may be mixed therewith. If the foreign matter is present in organic material layer 4, in some cases, anode 8 and cathode 3 may be short-circuited in that portion (hereinafter, referred to as a "foreign matter part"). When the short-circuit is generated, since neither the electrons nor the holes is injected into light emitting layer 6, light emitting layer 6 does not emit light 1. For this reason, a repair method for releasing the short-circuit to cause light emitting layer 6 to emit light 1 is proposed.

Japanese Patent Unexamined Publication No. 2007-042498 discloses a repair method of destroying the short-circuited portion by the irradiation of laser to remove the short-circuit. Furthermore, Japanese Patent Unexamined Publication No. 2001-117534 discloses another repair method of destroying the short-circuited portion by applying a reverse bias to remove the short-circuit. By performing the repair method, the short-circuit is removed to cause parts other than the short-circuited portion (the destroyed part) to function normally, whereby light emitting layer 6 emits light 1.

However, since the portion destroyed by the repair method does not emit light, the organic EL device, in which the repair method is implemented, has a problem in that brightness is reduced compared to a normal EL device which does not need to implement the repair method.

SUMMARY

In view of the problem, an object of the embodiments is to provide a method of manufacturing an organic EL device that improves the brightness, and an organic EL device.

In order to achieve the object mentioned above, according to an embodiment, there is provided a method of manufacturing an organic EL device that includes providing a device which has a first electrode, a second electrode facing the first electrode, and an organic layer that is disposed between the first electrode and the second electrode and has a first electrical resistance value; and transmitting a pulsed laser through the first electrode to irradiate the organic layer with the pulsed laser, and forming a conductive part, which has a second electrical resistance value lower than the first electrical resistance value, in the organic layer.

As mentioned above, the method of manufacturing the organic EL device makes it possible to improve the brightness of the manufactured organic EL device.

BRIEF DESCRIPTION OF THE DRAWINGS

FIG. 1 is a schematic diagram that shows an organic EL device according to an embodiment.

FIG. 2A shows a situation of irradiating the organic EL device with the pulsed laser according to the embodiment.

FIG. 2B shows a state where a conductive organic layer is formed by the irradiation of the pulsed laser according to the embodiment.

FIG. 3A shows a situation of irradiating the organic EL device with the pulsed laser so as to implement a thermal processing.

FIG. 3B shows a state where the organic layer is destroyed by the thermal processing.

FIG. 5 shows a table of conditions of the processing method of the organic EL device according to the embodiment.

DETAILED DESCRIPTION OF THE PREFERRED EMBODIMENT

Figure 4:
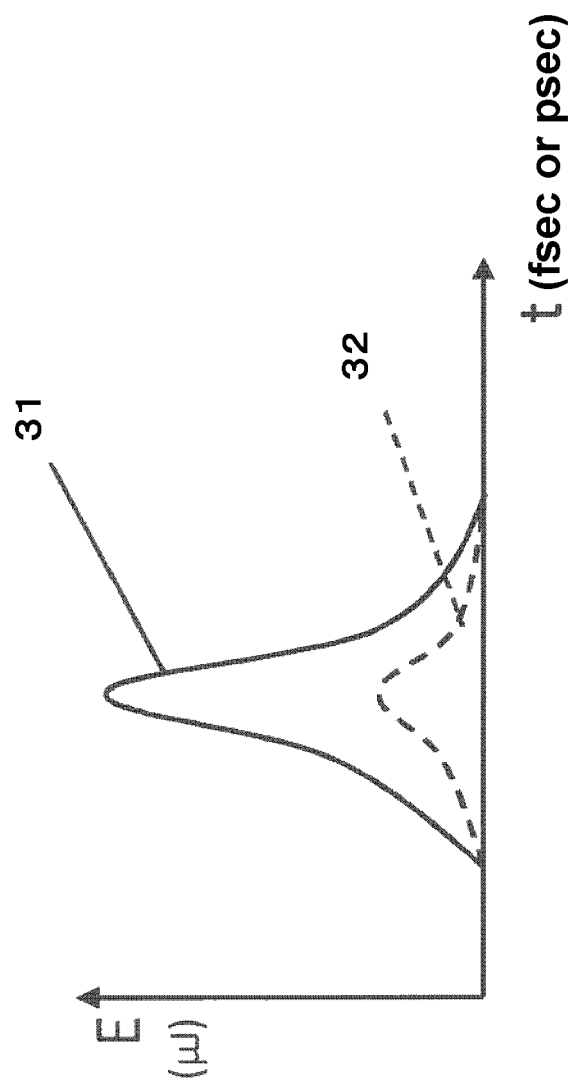
FIG. 4 is an explanatory diagram of an ablation processing and the thermal processing of the organic EL device by the pulsed laser.

Hereinafter, the method of manufacturing the organic EL device and the organic EL device according to the embodiment will be described with reference to the drawings. In the embodiment mentioned below, the same configurations are denoted by the same reference numerals and the descriptions thereof will be omitted.

FIG. 1 shows organic EL device 2 manufactured by the method according to the present embodiment. In organic EL device 2, foreign matter 10 is detected in the previous process, and a part of cathode 3 situated above foreign matter 10 is destroyed by the implementation of the repair method. The destroyed part is called insulated part 18.

The expression "destroy" means to destroy the function, that is, to prevent the electric current from flowing. Specifically, destroying cathode 3 means to form a space between cathode 3 and organic material layer 4, to form a crack by denaturing cathode 3, or to destroy cathode 3. The repair method may be a method of irradiating a part destroyed with laser, and a method of applying the reverse bias voltage to cathode 3 and anode 8. When applying the reverse bias voltage to cathode 3 and anode 8, the electric current flows only through foreign matter 10. Thus, foreign matter 10 is heated, and the periphery of the foreign matter 10 in the organic EL device 2 is destroyed by heat. In the description mentioned below, in some cases, implementing the repair method is simply described as being repaired.

In the case of applying the voltage to cathode 3 and anode 8 shown in FIG. 1, since the electrons are not injected from insulated part 18, organic material layer 4 situated below insulated part 18 does not emit light, and the part not emitting light becomes non-light emitting part 50. When organic EL device 2 is viewed from cathode 3 side, insulated part 18 is situated just above non-light emitting part 50, insulated part 18 becomes a non-lighting part that is not lighted. Due to the presence of the non-lighting part, the light emitting brightness of organic EL device 2 is lower than a normal EL device where the non-lighting part is not present.

Thus, in the present embodiment, a part of a normal part (a normal light-emitting portion of organic material layer 4, that is, a portion different from non-light emitting part 50) is irradiated with pulsed laser 11 to form conductive organic layer 24, thereby improving the light emitting brightness of organic EL device 2. In the description mentioned below, in some cases, irradiating pulsed laser 11 to form conductive organic layer 24 is simply described as a brightness improvement.

Next, a method of forming conductive organic layer 24 will be described with reference to FIGS. 2A and 2B. In order to simplify the description, organic layer material 4 constituted by multiple layers in FIG. 1 is briefly indicated as organic layer 23 of a single layer in FIGS. 2A and 2B. Organic material layer 4 shown in FIG. 1 and organic layer 23 shown in FIGS. 2A and 2B have the same function.

In the present embodiment, an ablation processing phenomenon by pulsed laser 11 is used so as to improve the brightness of organic EL device 2. The ablation processing is a phenomenon in which, when giving a solid material a momentary energy, elements constituting the material are discharged as various forms such as atoms, molecules, electrons or ions. FIG. 2A shows a situation in which pulsed laser 11 is focused onto organic layer 23. FIG. 2B shows a state where a part of organic layer 23 is subjected to the ablation processing by the pulsed laser 11, whereby conductive organic layer 24 is formed in organic layer 23.

When performing the ablation processing of organic layer 23, since organic layer 23 is disposed between cathode 3 and anode 8, atoms or the like discharged from organic layer 23 are not discharged to the outside, and the atoms or the like are separated in the inner part of organic layer 23 to generate an interaction. Organic layer 23 is an insulating material that has a resistance value (a first electrical resistance value) equal to or greater than 1 M$\Omega$ and has extremely low conductivity. However, it is considered that organic layer 23 has conductivity in response to the processing relative to the ablation processing.

Specifically, by performing the ablation processing on organic layer 23, binding substances (hydrogen, nitrogen, oxygen atoms or the like) other than carbon of organic layer 23, which is a polymer, are separated from carbons. Separated carbons are newly combined with each other, whereby a part of organic layer 23 is carbonized, and the carbonized organic layer 23 has conductivity. In this manner, conductive organic layer 24 is considered as carbonized organic layer 23 which is formed by irradiating organic layer 23 with pulsed laser 11 and performing the ablation processing. Carbon generally has conductivity.

As described with reference to FIG. 2B, in the inner part of organic layer 23, organic layer 24 is generated which has conductivity of an electrical resistance value lower than that of organic layer 23 (organic material layer 4 of FIG. 1). From the viewpoint of the electric resistance, due to the generation of organic layer 24, organic layer 23 enters a thinned state by conductive organic layer 24. Consequentially, electric current efficiency increases when applying the voltage between cathode 3 and anode 8. Thus, when applying the same voltage before and after the ablation processing, after the processing, the light emitting brightness of organic layer 23, in which conductive organic layer 24 is generated, is improved.

In addition, the thickness of organic layer 23 is equal to or less than 1 μm, and the thickness of conductive organic layer 24 is, for example, at least equal to 1 nm and no greater than 100 nm. Conductivity (a second electrical resistance value) of conductive organic layer 24 is, for example, equal to or greater than 100$\Omega$ and less than 1 k$\Omega$, and conductivity (the resistance value) of organic layer 23 including conductive organic layer 24 is, for example, equal to or greater than 1 k$\Omega$ and equal to or less than 500 k$\Omega$.

Meanwhile, when performing the thermal processing in place of the ablation processing, organic layer 23 is destroyed. The destruction of organic layer 23 due to the thermal processing will be described with reference to FIGS. 3A and 3B. FIG. 3A shows a situation in which organic layer 23 is irradiated with laser 110, and FIG. 3B shows a state where a part of organic layer 23 is destroyed. In a case where heat from laser 110 is applied to organic layer 23, the heat propagates in the inner part of organic layer 23, organic layer 23 is destroyed and insulated by the heat, and insulating layer 25 is formed. In this case, even if voltage is applied between cathode 3 and anode 8, the electric current does not flow in insulating layer 25. Thus, a portion of organic layer 23 situated above and below insulating layer 25 does not emit light, and the overall brightness of organic layer 23 is lowered.

However, it is also possible to create conductive organic layer of FIG. 2B by performing the ablation processing of insulating layer 25.

Next, a difference of each mode between the ablation processing and the thermal processing will be described with reference to FIG. 4. In FIG. 4, the longitudinal axis indicates energy E (μJ) of the laser pulse, and the transverse axis indicates time t (fsec (femtosecond) or psec (picosecond)). Solid line 31 indicates a pulse wave having energy (of the irradiated pulsed laser) required for the ablation processing, and dashed line 32 indicates a pulse wave having energy (of the irradiated pulsed laser) required for the thermal processing.

As shown in FIG. 4, the pulse waveform of the irradiated pulsed laser becomes a Gaussian distribution having a width in a time direction. Since the ablation processing is a phenomenon generated when strong energy enters the substance in a short period of time, as the energy peak value of the Gaussian distribution like the pulse wave shown by the solid line 31 is high, in the behavior of the processing due to the pulsed laser irradiation, the ablation processing becomes dominant. By irradiating the pulsed laser of the energy distribution, it makes possible to improve the brightness of the organic layer (the organic EL device). Meanwhile, if the energy peak value is low like the pulse wave shown by dashed line 32, a hem portion of the Gaussian distribution, that is, a portion having the greatest time width in the pulse waveform acts strongly, and in the behavior of the processing due to the pulsed laser irradiation, the thermal processing becomes dominant.

That is, irradiating the pulsed laser at low energy for a long period of time is identical to heating the target substance (the thermal processing). Since it is possible to destroy the target by the thermal processing, the thermal processing is used when forming insulated part 18 shown in FIG. 1, that is, in the repair. The thermal processing can be performed by laser 110 shown in FIG. 3A. Thus, it is possible to form insulated part 18 shown in FIG. 1 by laser 110 shown in FIG. 3A. In the description mentioned below, in some cases, forming insulated portion 18 shown in FIG. 1 by laser 110 shown in FIG. 3A is simply described as the repair.

Figure 6:
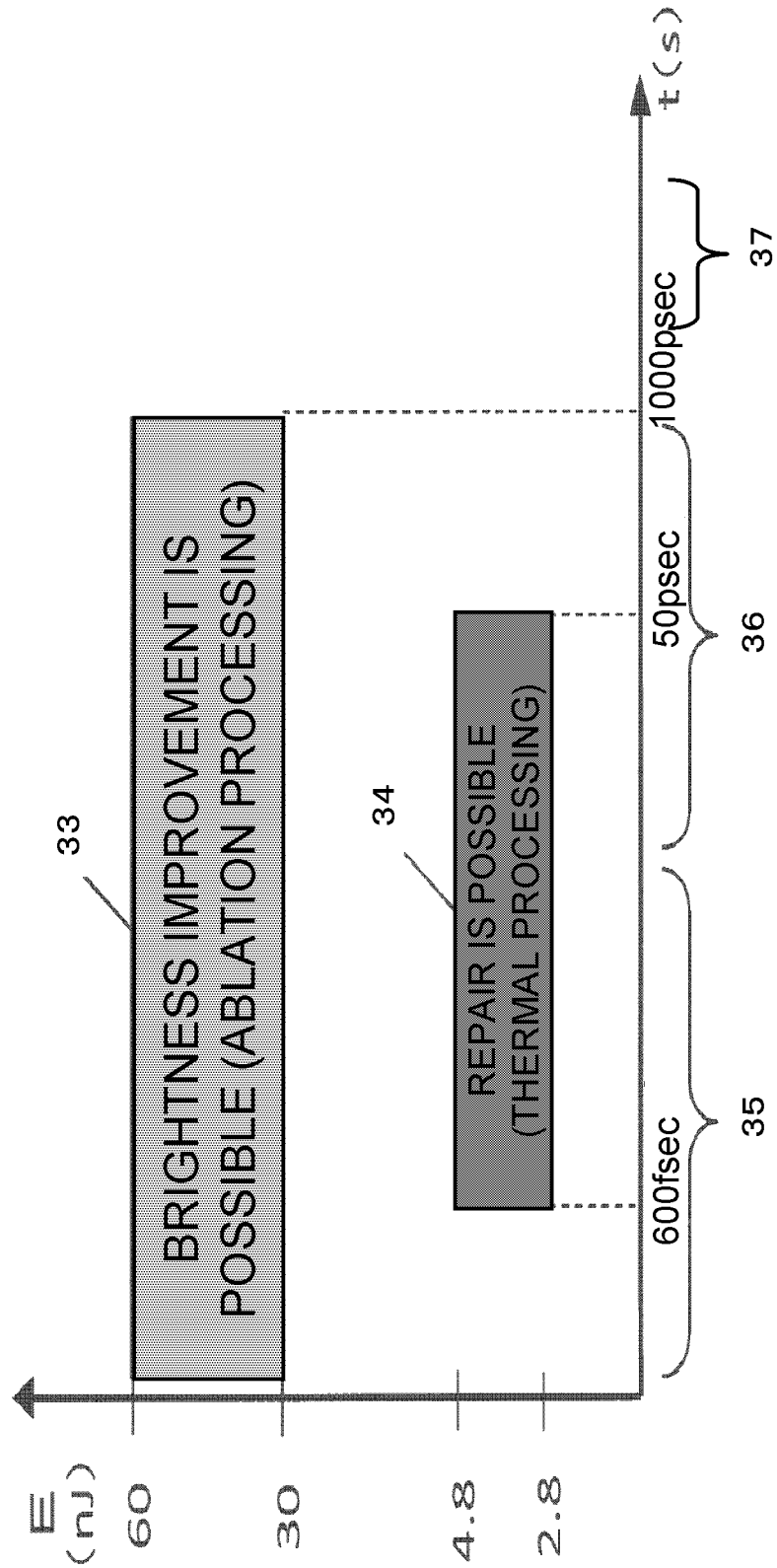
FIG. 6 shows conditions of the pulsed laser used in a method of improving a brightness of and in a repair method of the organic EL device according to the embodiment.

FIG. 5 shows a summarized table according to the pulsed laser in which energy, pulse width band, processing mode, and wavelength band realizing the brightness improvement and the repair of organic EL device 2 (organic layer 23). FIG. 6 shows the energy band and the pulse band of the pulsed laser realizing the brightness improvement and the repair of organic EL device 2 (organic layer 23) based on the table of FIG. 5. In FIG. 6, the pulse width t (sec) is classified into femtosecond pulse band 35, picosecond pulse band 36, and nanosecond pulse band 37.

Energy band 33 indicates that the pulse width of the pulsed laser allowing the brightness improvement of organic EL device 2 (organic layer 23) is at least equal to 1 fsec and no greater than 1,000 psec, and the energy width is at least equal to 30 nJ and no greater than 60 nJ. That is, even if the pulsed laser having the pulse width or the energy value other than this range is irradiated, it is impossible to perform the ablation processing and realize the brightness improvement of organic EL device 2. That is, the condition of the energy or the like satisfied by pulsed laser 11 shown in FIG. 1 is within the range of energy band 33 of FIG. 6.

Energy band 34 indicates that, in regard to the thermal processing for repair, the pulse width of the pulsed laser to be irradiated is at least equal to 600 fsec and no greater than 50 psec, and the energy value is at least equal to 2.8 nJ and no greater than 4.8 nJ. That is, the condition of the energy or the like of laser 110 shown in FIG. 3A is within the range of energy band 34 shown in FIG. 6. Generally, it is considered that the ablation processing cannot be performed by the use of the pulsed laser having the pulse width greater than 1,000 psec.

As shown in FIG. 6, the energy width in energy band 33 capable of improving the brightness of organic EL device 2 is considerably narrow. It is considered that this is due to the fact that organic layer 23 shown in FIG. 2A is thin that is equal to or less than several hundreds nm. In the case of irradiating organic layer 23 shown in FIG. 2B with the pulsed laser satisfying the condition outside the range of energy band 33, even if the ablation processing is performed, cathode 3 or anode 8 is adversely affected, or most of the light emitting layer (light emitting layer 6 in organic material layer 4 shown in FIG. 1) in organic layer 23 is carbonized.

When most of the light emitting layer is carbonized, organic EL device 2 does not emit light. That is, it is considered that the condition defined by energy band 33 shown in FIG. 6 is a condition for leaving the region of the light emitting layer included in organic layer 23 even if conductive organic layer 24 is formed on organic layer 23. The inventor predicts that the thickness of conductive organic layer 24 formed by this condition is thinner than the thickness of the light emitting layer included in organic layer 23.

In addition, as shown in FIG. 6, the pulse width band of the pulsed laser capable of realizing both of the brightness improvement and the repair of organic EL device 2 is at least equal to 600 fsec and no greater than 50 psec. That is, when using the pulsed laser of the pulse width band, it is possible to perform both of the repair of the brightness improvement of organic EL device 2.

In some cases, a sealing resin, a color filter, and a glass substrate are sequentially stacked on cathode 3 of organic EL device 2 shown in FIG. 1. In this case, in order to process organic material layer 4, there is a need to use the pulsed laser of the wave length which is transmitted through all of the glass plate, the color filter, and the sealing resin. The inventor experimentally elucidated that the wave length transmitted through all of them is equal to or greater than 900 nm. That is, when using the laser having the wave length equal to or greater than 900 nm as pulsed laser 11 shown in FIG. 1, even in a case where the sealing resin, the color filter, and the glass plate are stacked on cathode 3, the brightness improvement of organic layer 23 is possible.

Figure 7A:
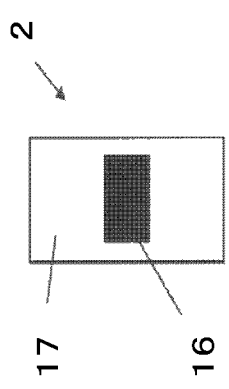
FIG. 7A shows the organic EL device after the implementation of the repair method prepared for irradiating the pulsed laser according to the embodiment.
Figure 7B:
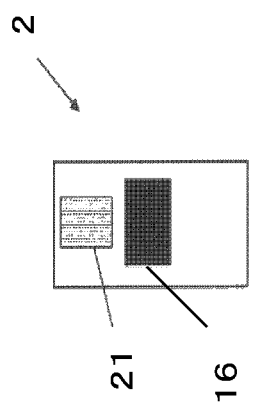
FIG. 7B shows a region of the organic EL device where the pulsed laser is irradiated according to the embodiment.
Figure 7C:
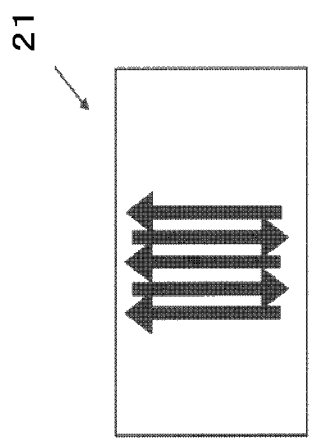
FIG. 7C shows a scanning trajectory of the pulsed laser according to the embodiment.

Next, the pulsed laser irradiation method for improving the brightness of organic EL device 2 (organic layer 23) will be described with reference to FIGS. 7A to 7C. FIGS. 7A to 7C show an aspect in which organic EL device 2 shown in FIG. 1 is viewed from cathode 3 side. More specifically, FIG. 7A shows lighting part 17 lighting the light and non-lighting part 16 not lighting the light in the case of applying the voltage to cathode 3 and anode 8 in organic EL device 2 after the repair. Lighting part 17 is a portion of normal organic EL device 2 in which neither insulated portion 18 nor conductive organic layer 24 shown in FIG. 1 is formed. Non-lighting part 16 is a portion in which insulated part 18 of FIG. 1 is formed by the repair. The position and the size of non-lighting part 16 coincide with those of non-lighting part 50 in light emitting layer 6 situated in the lower part of insulated part 18 shown in FIG. 1.

FIG. 7B shows organic EL device 2 in which the brightness improvement is performed and brightness improvement part 21 in which the brightness is improved. Brightness improvement part 21 is a region in which pulsed laser 11 shown in FIG. 1 is irradiated and is also a region on which conductive organic layer 24 is formed. A state where the brightness of brightness improvement part 21 shown in FIG. 7B is increased by 50% or more compared to the brightness of lighting part 17 shown in FIG. 7A is called a state with improved brightness. FIG. 7C shows the brightness improvement part 21 shown in FIG. 7B together with the scanning direction of the pulsed laser (pulsed laser 11 of FIG. 1) irradiated for brightness improvement in an enlarged manner.

As shown in FIG. 7C, lighting part 17 in organic EL device 2 (a state where non-lighting part 16 by the repair already exists) after the repair shown in FIG. 7A is irradiated with the pulsed laser, whereby the brightness improvement of organic EL device 2 is promoted. Conductive organic layer 24 shown in FIG. 1 is formed in a position where the pulsed laser is irradiated. Thus, by moving the pulsed laser so as to draw a trajectory indicated by an arrow in FIG. 7C, it is possible to expand an area of brightness improvement part 21. By controlling the area of brightness improvement part 21, the brightness of organic EL device 2 can be controlled. Organic EL device 2 formed with non-lighting part 16 by the repair has brightness lower than a normal organic EL device which does not need to perform the repair (non-lighting part 16 does not exist). When controlling the area of brightness improvement part 21 so as to compensate brightness difference between the organic EL device and normal organic EL device 2, it is possible to make the brightness of organic EL device 2 formed with non-lighting part 16 coincide with the brightness of the normal organic EL device.

Hereinafter, a specific example of the effect of the brightness improvement will be described. In brightness improvement part 21 formed by the irradiation of the pulsed laser having the energy band at least equal to 30 nJ and no greater than 60 nJ, the pulse width of 800 fsec, and the wave length equal to or greater than 900 nm, an improvement in brightness of 1.5 to 2.5 times compared to the brightness of lighting part 17 is experimentally achieved. For example, the area of non-lighting part 16 after the repair is 30 μm×30 μm, the brightness of brightness improvement part 21 is twice the brightness of lighting part 17, and the laser irradiation width of the pulsed laser to be irradiated is 3 μm. As shown in FIG. 7C, the trajectory of the laser scanning is set such that scanning is performed in a transverse direction five times by setting the scanning width of the longitudinal direction to 30 μm. In this case, the area of the region, in which the pulsed laser is irradiated, is 30 μm×15 μm.

When increasing the laser irradiation width, the number of drawings can be reduced, but the minute adjustment of the brightness to be improved is difficult. In an actual drawing speed improvement, it is considered that the pulsed laser beam from an oscillator is split by a splitter or the like and is concurrently drawn. There is no need to determine the number of the drawings before the processing, and the pulsed laser may be irradiated while confirming the entire brightness of organic EL device 2. For example, the pulsed laser is firstly irradiated once in a line shape, then, organic EL device 2 is lighted, after confirming the aspect and the size of the brightness improvement by a camera, the laser pulse is irradiated again, and the irradiation is continued until organic EL device 2 has the same brightness as that of a cell of a normal state.

Brightness improvement part 21 is formed in an arbitrary position around non-lighting part 16. Brightness improvement part 21 does not need to be formed in a vertical shape but may be formed in a horizontal shape or a square shape. Brightness improvement part 21 is not limited to one location in organic EL device 2 but may be provided in two locations or more. A region, where pulsed laser 11 is irradiated, may be determined based on the film thickness distribution of organic layer 23 in organic EL device 2 shown in FIGS. 2A and 2B.

Figure 8:
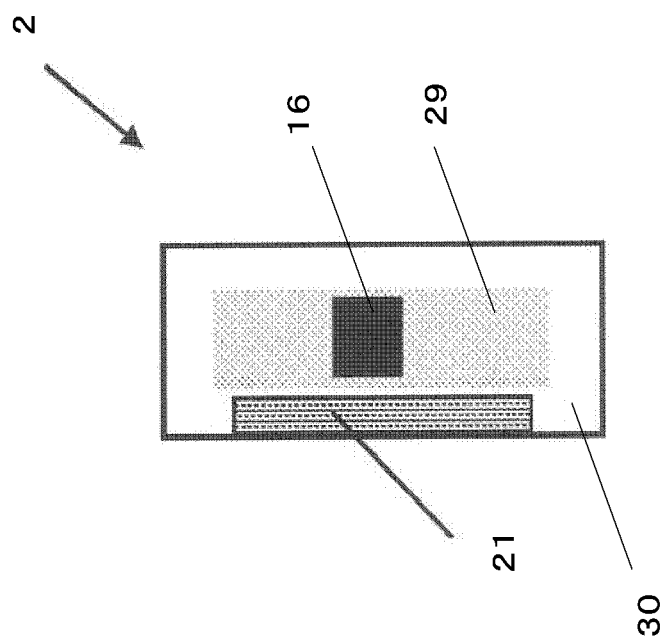
FIG. 8 is a schematic diagram of the organic EL device that includes an organic layer having a film thickness distribution according to the embodiment.

Next, a method of implementing the brightness improvement when the film thickness distribution is present in organic layer 23 will be described with reference to FIG. 8. FIG. 8 shows an aspect in which organic EL device 2 of FIGS. 2A and 2B is viewed from cathode 3 side. In FIG. 8, a case is shown where non-lighting part 16 exists in portion 29 having the thin film thickness (equal to or less than 100 nm) (of organic layer 23 in FIG. 2A). In a case where the film thickness is thin, in some cases, when irradiating the pulsed laser, a part having conductivity is completely generated in the thickness direction of organic layer 23, whereby the short-circuit may be generated between the electrodes. Thus, by irradiating portion 30 having the thick film thickness (a portion of 150 nm or more, especially, a portion in which light emitting layer 6 shown in FIG. 1 is equal to or greater than 150 nm) with the pulsed laser to form brightness improvement part 21, brightness improvement part 21 is prevented from having conductivity completely in the thickness direction of organic layer 23. In addition, since the film thickness distribution is generated with high probability in the case of forming organic layer 23, it is effective to grasp the film thickness distribution in advance and form brightness improvement part 21 in a location having a greater thickness.

Next, a focal position of the pulsed laser of organic EL device 2 in the thickness direction will be described with reference to FIGS. 9A and 9B. When irradiating laser 110 for repair, as shown in FIG. 9A, laser 110 is focused onto the position of cathode 3.

Figure 9B:
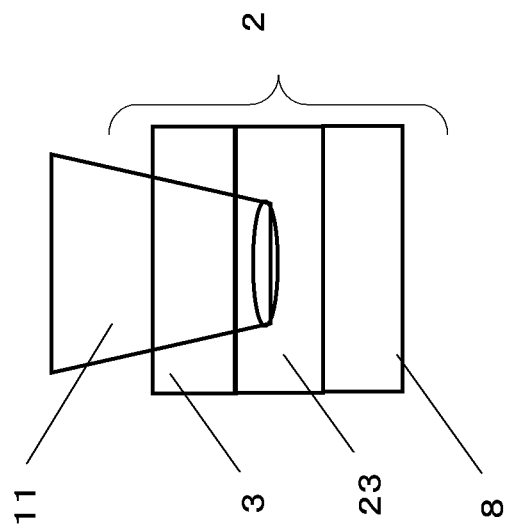
FIG. 9B shows a focal position of the pulsed laser during the process of the method of improving the brightness according to the embodiment.
Figure 9A:
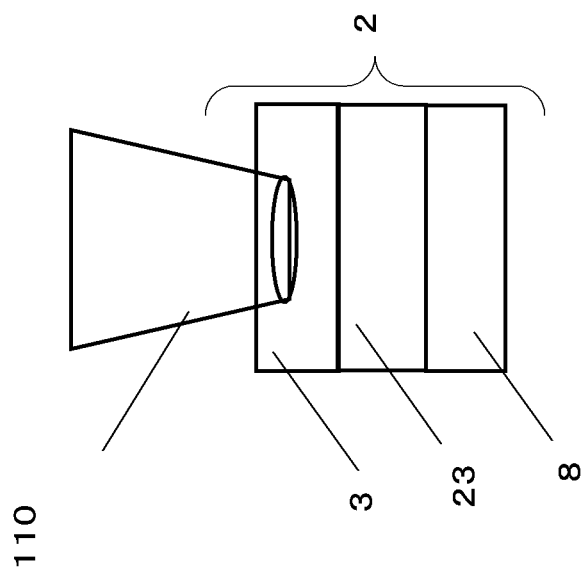
FIG. 9A shows a focal position of the pulsed laser during the process of the repair method.

When irradiating laser 11 for brightness improvement, as shown in FIG. 9B, pulsed laser 11 is focused on the position of organic layer 23. Since organic layer 23 is situated lower than cathode 3, the position on which pulsed laser 11 is focused during brightness improvement processing is set to the part lower than that when performing the repair processing. For example, in a case where the thickness of cathode 3 is 100 nm and the thickness of organic layer 23 is 1 μm, the position on which pulsed laser 11 is focused is lowered compared to the case when the repair is performed by about 500 nm, and the irradiation of pulsed laser 11 for brightness improvement is performed.

In the case of setting the position on which pulsed laser 110 is focused to cathode 3, energy of laser 110 is concentrated on cathode 3, and energy, by which the carbon joining is separated, does not act on organic layer 23. For this reason, organic layer 23 is not subjected to the ablation processing, and the brightness improvement does not occur.

In the case of setting the position on which pulsed laser 11 is focused to organic layer 23 when performing the brightness improvement processing, cathode 3 is not processed and is not repaired. That is, when performing the repair processing, by setting the position on which pulsed laser 110 is focused to cathode 3 and setting the position on which pulsed laser 11 is focused to organic layer 23 when the brightness is improved, cathode 3 and organic layer 23 are processed individually and respectively. The position on which pulsed laser 11 is focused is determined in advance based on a focal distance of a lens for focusing pulsed laser 11, a design value of the thickness of cathode 3, and a design value of the thickness of organic EL device 2.

Figure 10A:
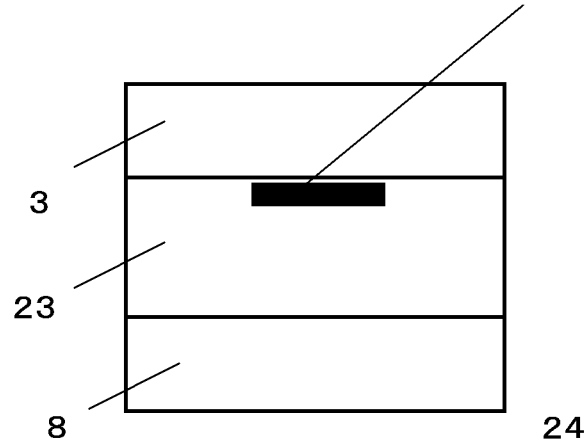
FIG. 10A shows the organic EL device in which a conductive organic layer is situated in an upper part of the organic layer according to the embodiment.
Figure 10B:
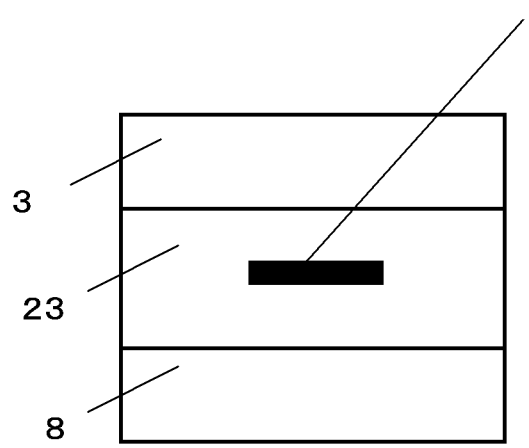
FIG. 10B shows the organic EL device in which the conductive organic layer is situated in a middle part of the organic layer according to the embodiment.
Figure 10C:
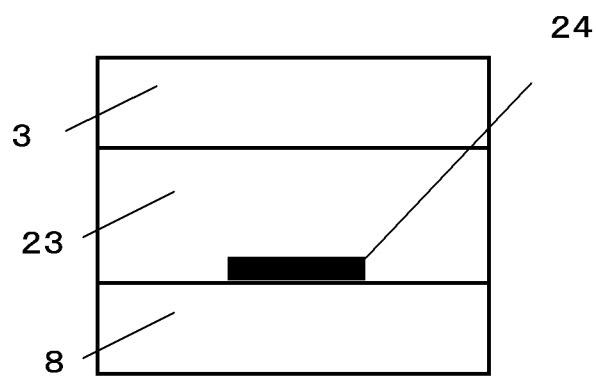
FIG. 10C shows the organic EL device in which the conductive organic layer is situated in a lower part of the organic layer according to the embodiment.

Next, the position of conductive organic layer 24 will be described. When the position on which pulsed laser 11 is focused is set to organic layer 23, organic EL device 2 after the brightness improvement is considered as the states of FIGS. 10A, 10B and 10C. FIG. 10A shows a state where conductive organic layer 24 comes into contact with cathode 3 in the upper part of organic layer 23. FIG. 10B shows a state where conductive organic layer 24 is present in the middle of organic layer 23. FIG. 10C shows a state where conductive organic layer 24 comes into contact with anode 8 in the lower part of organic layer 23. In any state shown in FIGS. 10A, 10B and 10C, the brightness improvement is possible. If cathode 3 and anode 8 are not electrically connected to each other, conductive organic layer 24 may be formed in any position in the organic layer 23. That is, as shown in FIGS. 10C and 10A, respectively, conductive organic layer 24 may be formed which does not contact with at least one of cathode 3 and anode 8.

Figure 11:
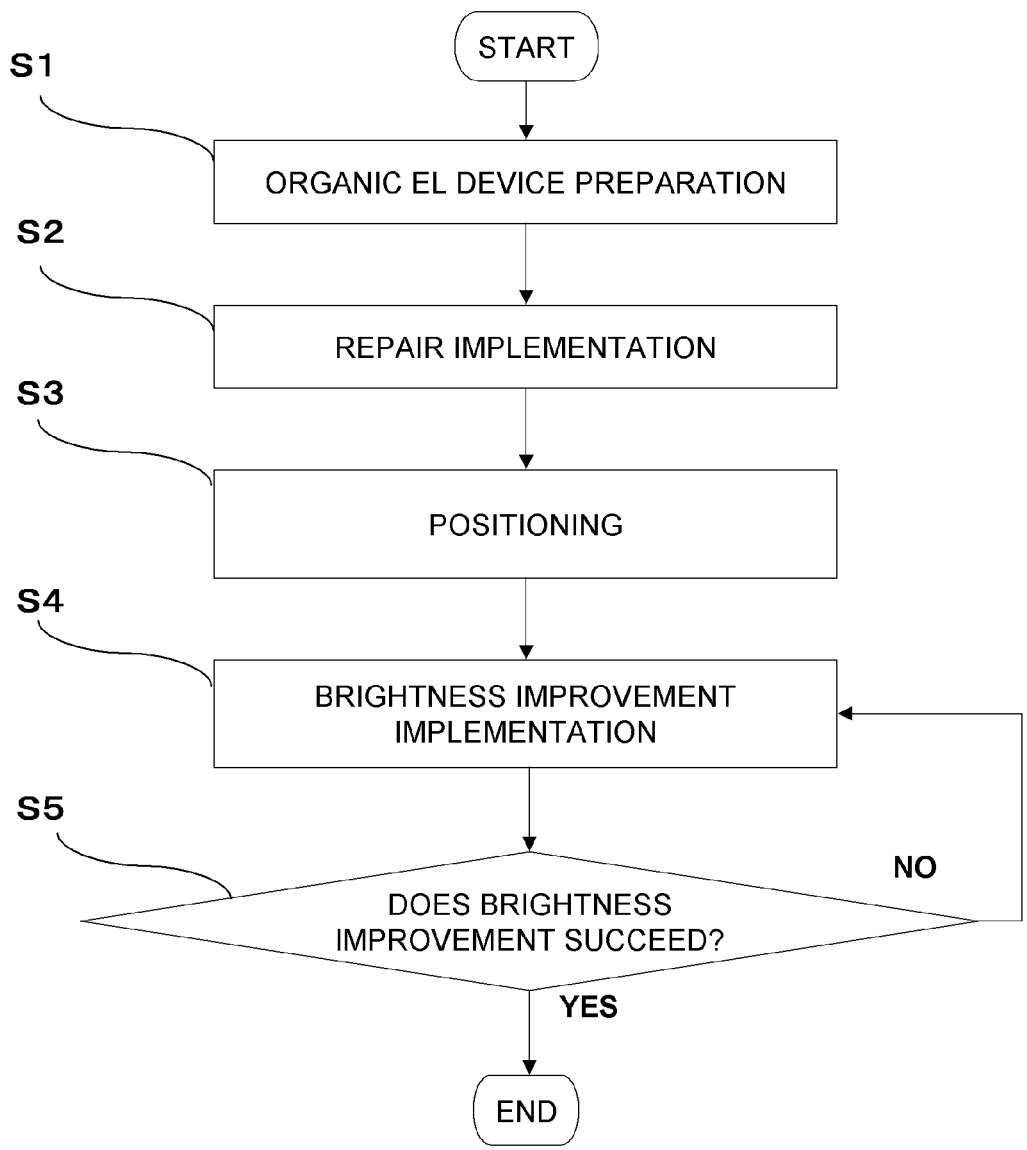
FIG. 11 is a flow chart that shows a method of manufacturing the organic EL device according to the embodiment.
Figure 12:
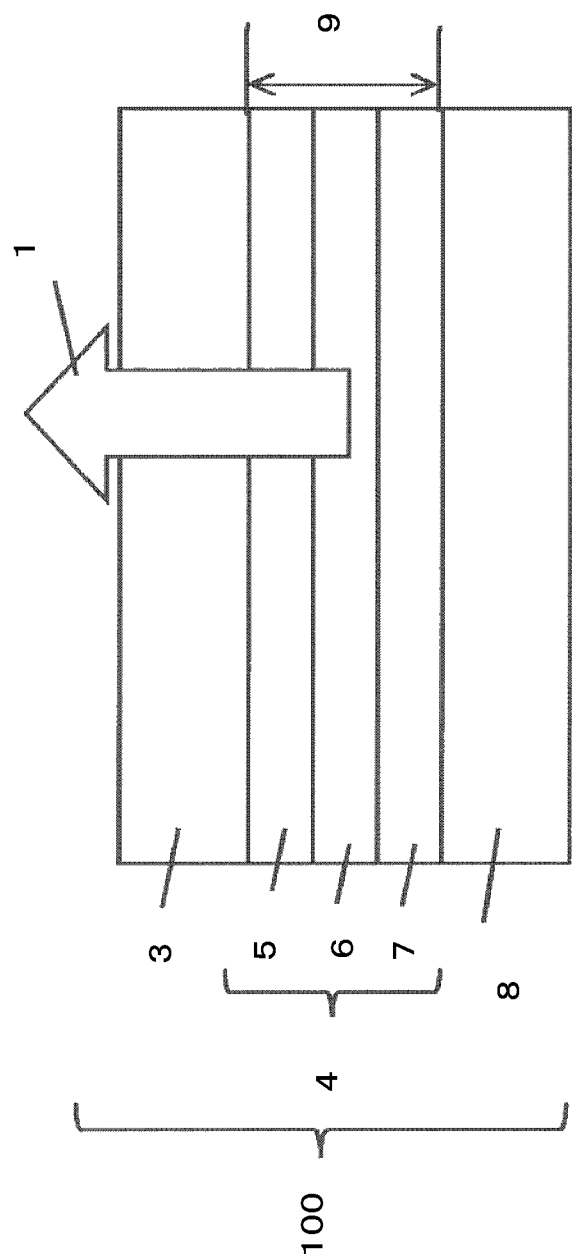
FIG. 12 is a schematic diagram that shows the organic EL device.

Next, a method of manufacturing organic EL device 2 according to the present embodiment will be described with reference to FIGS. 11 and 1. In step S1, organic EL device 2 (a device) is provided in which insulated part 18 is not formed. Provided organic EL device 2 includes cathode 3 (a transparent first electrode), anode 8 (a second electrode) facing cathode 3, and organic material layer 4 (an organic layer) disposed between cathode 3 and anode 8. Organic EL device 2 provided at this time may be any organic EL device of a top emission type, a bottom emission type, a three color type, a color conversion type or a color filter type. In addition, the transparent electrode that is cathode 3, for example, is composed of an ITO (Indium. Tin Oxide). In addition, the phrase "transparent" means that the visible light (390-750 nm) is transmitted with a transmission factor of 80-100%.

In step S2, the defect of organic EL device 2 is inspected, and if foreign matter 10 is detected as a consequence of the inspection, the repair is performed on organic EL device 2 in which foreign matter 10 is detected. The inspection of the defect of organic EL device 2 is performed by a camera, an optical sensor, a visual observation or the like. In addition, in step S1, in the case of providing organic EL device 2 in which the repair is performed in advance, the process proceeds to step S3 without performing step S2.

In step S3, organic EL device 2 after the repair is observed by the camera or the like, a position or a region, where pulsed laser 11 is irradiated for improving the brightness, is determined, and the process proceeds to step S4.

In step S4, the position on which pulsed laser 11 is focused is set to organic material layer 4 and pulsed laser 11 transmitted through cathode 3 is irradiated to organic material layer 4, thereby performing the brightness improvement. In step S4, conductive organic layer (a conductive part) 24 is formed.

In step S5, it is estimated whether or not the brightness improvement succeeds. In the estimation, organic EL device 2 is observed by the camera or the like. Herein, it is estimated whether or not the brightness improvement of 50% or more is recognized compared to a preset quality product as an example. If the brightness improvement is less than 50% as an example, the process returns to step S4 again (N of step S5), and if the brightness improvement is equal to or greater than 50%, the operation is finished (Y of step S5).

Organic EL device 2 is manufactured via steps S1 to S5 mentioned above.

In addition, only the irradiation of pulsed laser 11 shown in FIG. 1 for brightness improvement may be performed to manufacture organic EL device 2, without performing the repair. For example, in a case where the size of foreign matter 10 is minute, that is, tens of nm, a minute current leakage (an order of pA or less) is generated instead of a complete short between electrodes, whereby the brightness of organic EL device 2 may be lowered. At this time, since there is a possibility that minute foreign matter 10 cannot be detected by the inspection such as an appearance inspection, only the brightness improvement may be performed without performing the repair (step S2 in FIG. 11). As a result, it is possible to manufacture organic EL device 2 having the improved brightness. Furthermore, by including conductive organic layer 24, it is possible to increase the brightness of organic EL device 2 compared to the state where conductive organic layer 24 is not included.

The organic EL device according to the present embodiment can be used, for example, in an organic EL display, an organic EL illumination or the like. The method of manufacturing the organic EL device according to the present embodiment can be applied at the time of manufacturing the organic EL device which is used in the organic EL display, the organic EL illumination or the like.

The preferred embodiment is sufficiently described while referring to the accompanying drawings, but various variations or modifications may be evident to those skilled in the art. It is, of course, understood that the variations or modifications are included in the preferred embodiments in so far as they do not deviate from the scope of the appended claims.

What is claimed is:

1. An organic EL device comprising:
   a first electrode;
   a second electrode that faces the first electrode;
   an organic layer which is disposed between the first electrode and the second electrode and has a first electrical resistance value; and
   a conductive part which is disposed in the organic layer and has a second electrical resistance value lower than the first electrical resistance value,
   wherein the conductive part is the organic layer which has carbonized.

2. An organic EL device comprising:
   a first electrode;
   a second electrode that faces the first electrode;
   an organic layer which is disposed between the first electrode and the second electrode and has a first electrical resistance value; and
   a conductive part which is disposed in the organic layer and has a second electrical resistance value lower than the first electrical resistance value,
   wherein the conductive part is formed by irradiating the organic layer with a pulsed laser having a pulse width at least equal to 1 fsec and no greater than 1,000 psec, and having energy at least equal to 30 nJ and no greater than 60 nJ.

3. The organic EL device of claim 1,
   wherein the conductive part does not contact the first electrode and the second electrode.

4. An organic EL device comprising:
   a first electrode;
   a second electrode that faces the first electrode;
   an organic layer which is disposed between the first electrode and the second electrode and has a first electrical resistance value; and
   a conductive part which is disposed in the organic layer and has a second electrical resistance value lower than the first electrical resistance value,
   wherein the conductive part is in a portion of the organic layer having a greatest thickness.

5. An organic EL device comprising:
   a first electrode;
   a second electrode that faces the first electrode;
   an organic layer which is disposed between the first electrode and the second electrode and has a first electrical resistance value; and
   a conductive part which is disposed in the organic layer and has a second electrical resistance value lower than the first electrical resistance value,
   wherein the organic layer has a non-light emitting part, and the conductive part is in a position different from the non-light emitting part.

\* \* \* \* \*